United States Patent
Nastasi et al.

(10) Patent No.: US 6,762,452 B2
(45) Date of Patent: Jul. 13, 2004

(54) NON-VOLATILE MEMORY CELLS INTEGRATED ON A SEMICONDUCTOR SUBSTRATE

(75) Inventors: Nicola Nastasi, Milazzo (IT); Dorotea Arcidiacono, Pedara (IT); Stefano Mazzali, Carnate (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/325,289

(22) Filed: Dec. 20, 2002

(65) Prior Publication Data

US 2003/0092237 A1 May 15, 2003

Related U.S. Application Data

(62) Division of application No. 09/750,449, filed on Dec. 28, 2000, now Pat. No. 6,498,083.

(30) Foreign Application Priority Data

Dec. 31, 1999 (EP) .............................................. 99830828

(51) Int. Cl.[7] .............................................. H01L 29/788
(52) U.S. Cl. ....................... 257/316; 257/314; 257/315; 438/257; 438/593; 438/594
(58) Field of Search ................................ 438/257–258, 438/593–596; 257/314–316, 321

(56) References Cited

U.S. PATENT DOCUMENTS

| | | | |
|---|---|---|---|
| 5,493,140 A | 2/1996 | Iguchi | 257/316 |
| 5,963,480 A | 10/1999 | Harari | 365/185.29 |
| 5,973,353 A | 10/1999 | Yang et al. | 257/315 |
| 6,284,637 B1 * | 9/2001 | Chhagan et al. | 438/594 |
| 6,309,928 B1 | 10/2001 | Sung et al. | 438/265 |
| 6,482,728 B2 * | 11/2002 | Shin et al. | 438/593 |

OTHER PUBLICATIONS

Patent Abstracts of Japan, vol. 1995, No. 11, (Dec. 26, 1995) & JP 07 202047 A (Fujitsu Ltd; Others: 01), (Aug. 4, 1995).

Patent Abstracts of Japan, vol. 1998, No. 10, (Aug. 31, 1998) & JP 10 125812 A (Toshiba Corp), (May 15, 1998).

* cited by examiner

Primary Examiner—Dung A. Le
(74) Attorney, Agent, or Firm—Lisa K. Jorgenson; Allen, Dyer, Doppelt, Milbrath & Gilchrist, P.A.

(57) ABSTRACT

A memory device may include a semiconductor substrate, an oxide layer defining spaced apart active areas in the semiconductor substrate, and a floating gate region on each respective active area. The floating gate region may have sidewalls that are slanted with respect to a surface of the semiconductor substrate. Moreover, the memory device may also include a plug in the oxide layer.

21 Claims, 5 Drawing Sheets

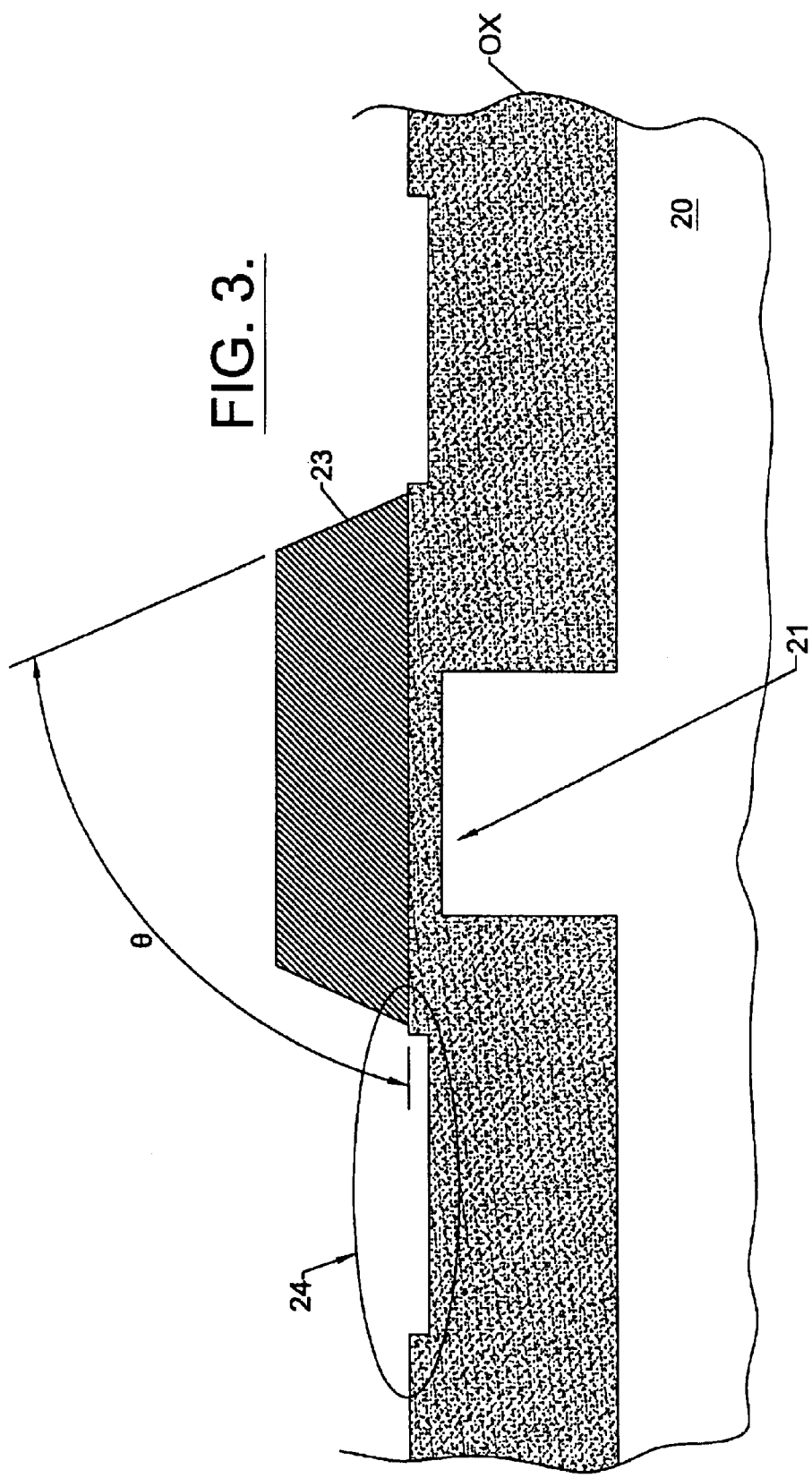

NON-VOLATILE MEMORY CELLS INTEGRATED ON A SEMICONDUCTOR SUBSTRATE

This application is a divisional of Ser. No. 09/750,449 filed on Dec. 28, 2000, now U.S. Pat. No. 6,498,083, the disclosure of which is hereby incorporated by reference in its entirety.

FIELD OF THE INVENTION

The present invention relates to the field of electronic circuits, and, more particularly, to a process for manufacturing non-volatile memory cells integrated on a semiconductor substrate, such as flash EEPROM cells.

Specifically, the invention relates to a process for manufacturing electronic non-volatile memory devices which are integrated on a semiconductor substrate and constructed with a matrix of memory cells having floating gate regions formed for respective active areas.

The invention particularly, but not exclusively, relates to an improved method of planarizing matrices of non-volatile memory cells, such as flash EEPROM memory cells. The description which follows will make reference to this application field for convenience of explanation only.

BACKGROUND OF THE INVENTION

As is well known in the art, semiconductor integrated electronic flash EEPROM memory devices include a plurality of non-volatile memory cells which are organized in matrix form. That is, the cells are organized into rows (or word lines) and columns (or bit lines). Each non-volatile memory cell includes a MOS transistor provided with a floating gate above its channel region, i.e., an electrode having a high direct impedance to all the other terminals of the same cell and of the circuit where the cell is connected.

The cell also includes a second electrode, the control gate, which is driven by appropriate control voltages. Of course, the transistor also includes drain and source electrodes. A known process flow for manufacturing flash EEPROM memory cells 1 integrated in a semiconductor substrate 2 is illustrated in FIGS. 1A–1E. In these figures there are shown vertical cross-sections taken along a parallel direction to the word lines but shifted therefrom to highlight the standard process steps in those areas.

This prior art process provides a plurality of active areas formed in the substrate. The memory cells to be formed later will be separated from one another by portions of a field oxide layer FOX. On the substrate 2, a first dielectric layer 3, known as the tunnel oxide, and a layer 4 of polycrystalline silicon, are then formed. Thereafter, the layer 4 is patterned to provide a plurality of polycrystalline silicon strips 5, known as floating gates, which are parallel to one another. Such strips 5 are separated and isolated from the substrate 2 by the oxide layer 3, as shown in FIG. 1B.

Following deposition of an interpoly dielectric layer 6, the standard process flow includes defining the word lines 7 by forming a layer 8 of polycrystalline silicon (known as Poly2) and a layer 9 of a metallic silicide $MSi_x$, where the metal may be tungsten or cobalt, for example.

This metallic silicide layer 9 is cascaded onto, or formed in situ, by a silicidation process on the previously defined Poly2 layer. The word lines 7 are then defined by a photolithographic process using a resist mask such that such word lines 7 will lie perpendicular to the floating gate strips 5. The word lines 7 and floating gate strips 5 typically are defined using a "self-aligned cell" technique including a series of plasma etching operations which may be carried out sequentially or in several operations optionally separated by suitable cleaning steps between an etch step and another step.

In the latter case, the etching of the word lines 7 including silicide/Poly2 reaches the interpoly oxide layer 6. While having many advantageous aspects, this prior art process has drawbacks. This memory cell patterning is actually subject to faults due the cell morphology. In fact, the spacing of the floating gate strips 5 causes corrugations to appear in the Poly2 layer 8 deposited over the floating gate strips 5, with hollows of increasing depth as the dimensions of the device are scaled, as shown in FIG. 1C.

This results in the development of possible cracks 10 in the metallic silicide layer 9 of the word lines. Such cracks 10 are more likely to appear after the cell is sealed by thermal oxidation, upon completion of its patterning, and especially in devices having a layer of $WSi_x$ deposited over the Poly2 layer. In the latter devices, the deposition of a second layer 9 intensifies this creasing effect and, with it, the strain on the deposited silicide film.

Faults of this kind give rise to two major disadvantages. First, a high resistance of the word lines 7 and associated negative effects on the electrical performances of the device may result. Also, where an organic anti-reflection layer is used in patterning the matrix, an increased rate of rejects or increased redundancy consumption due to shorts occurring between rows and/or cells may occur. The anti-reflection layer would penetrate cracks 10, and if its etching is dedicated and non-selective to the silicide layer 9, removal of the layers of Poly2 8 and silicide 9 would cause the formation of residues 11, as shown in FIG. 1E.

Another important aspect of patterning matrices which include flash memory cells is the etching used for the removal of the interpoly dielectric layer 6 to define the source and drain lines in the substrate, as shown in FIG. 1F. This operation causes the loss of a certain thickness of the exposed insulating dielectric at the end of the $MSi_x$/Poly2 etching. A reduced thickness of the field oxide may cause the possible failure of the channel insulation upon implantation (i.e., the formation of shifts).

The underlying technical problem of this invention is to provide a process for manufacturing non-volatile memory cells with structural features able to reduce cracking at the word lines and preserve the insulation during the cell patterning, such that the drawbacks present in prior art devices may be overcome.

SUMMARY OF THE INVENTION

An object of the invention is to provide patterning of the floating gate regions with sidewalls slanted with respect to the surface of the substrate along a parallel direction to the word lines.

These and other objects, features, and advantages in accordance with the present invention are provided by a method for manufacturing electronic non-volatile memory devices on a semiconductor substrate including a matrix of memory cells having floating gate regions formed on respective active areas and an oxide layer separating the active areas. The method may include forming sidewalls of the floating gate regions that are slanted with respect to a surface of the semiconductor substrate, forming a trench in the oxide layer following the formation of the floating gate regions, and forming a plug of polycrystalline silicon in the trench. The slanted sidewalls of the floating gate regions provide a lead-in for the formation of upper layers.

More particularly, the floating gate regions may be formed by end-point etching. Furthermore, the walls of the floating gate regions may be slanted at an inclination angle of less than 85° with respect to the surface of the semiconductor substrate. The trench may be formed by over-etching through the oxide layer. Also, the plug may fill only a portion of the trench.

A memory device according to the invention includes a semiconductor substrate, an oxide layer defining spaced apart active areas in the semiconductor substrate, a floating gate region on each respective active area, and at least one plug in the oxide layer. The sidewalls may be slanted with respect to a surface of the semiconductor substrate.

BRIEF DESCRIPTION OF THE DRAWINGS

The features and advantages of the invention will be appreciated from the following description of an embodiment thereof, given by way of non-limitative example, with reference to the accompanying drawings, in which:

FIG. 3 is a cross-sectional view of a gate region according to the present invention.

DETAILED DESCRIPTION OF THE PREFERRED EMBODIMENTS

Figure 1A:
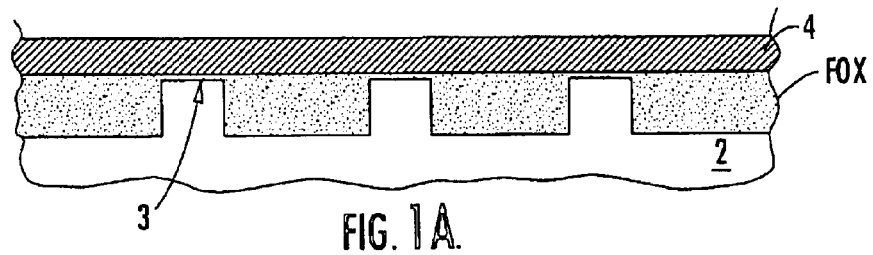
FIGS. 1A to 1G are vertical cross-sectional views, drawn to an enlarged scale, of a portion of a semiconductor substrate in the course of one embodiment of a prior art fabrication process.
Figure 1B:
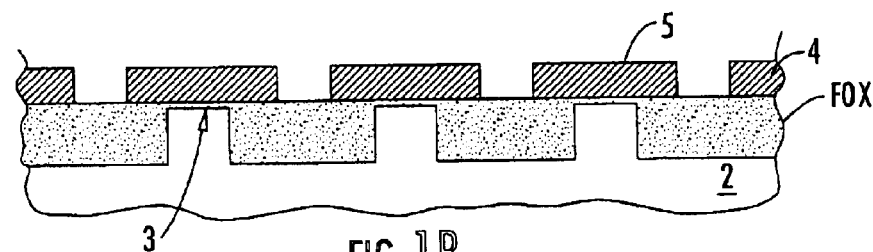
Figure 1C:
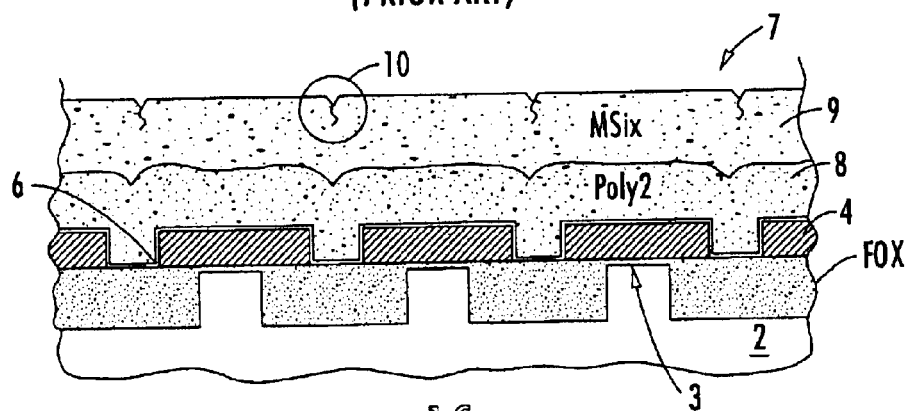
Figure 1D:
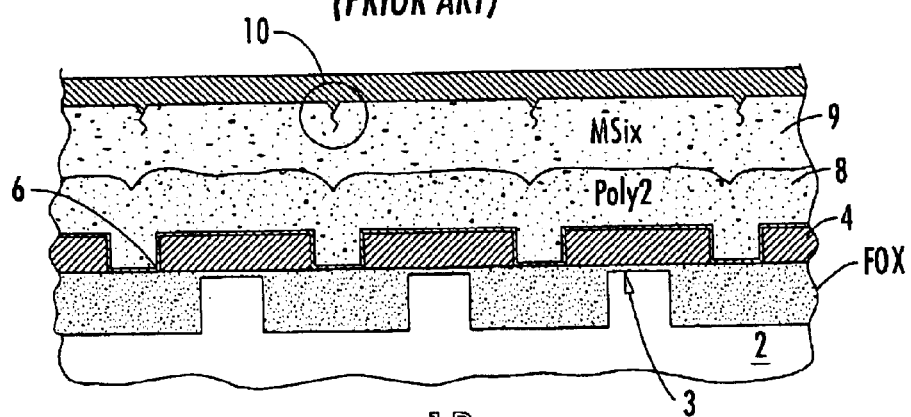
Figure 1E:
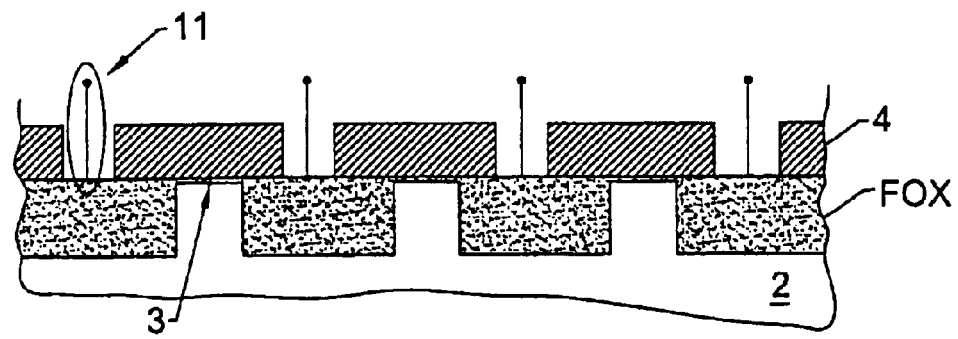
Figure 1F:
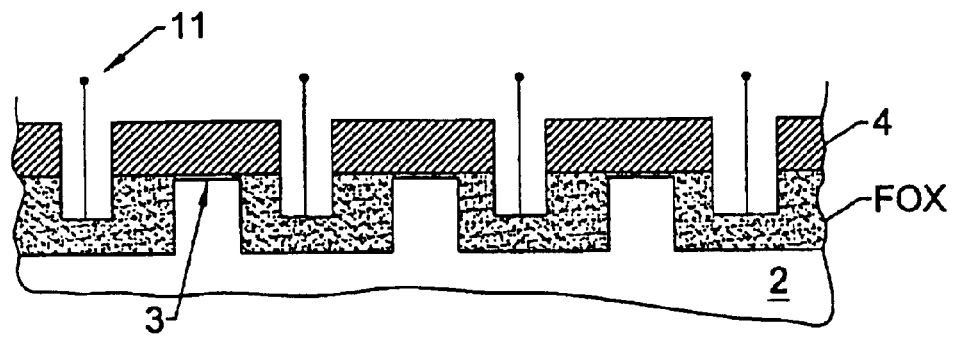
Figure 1G:
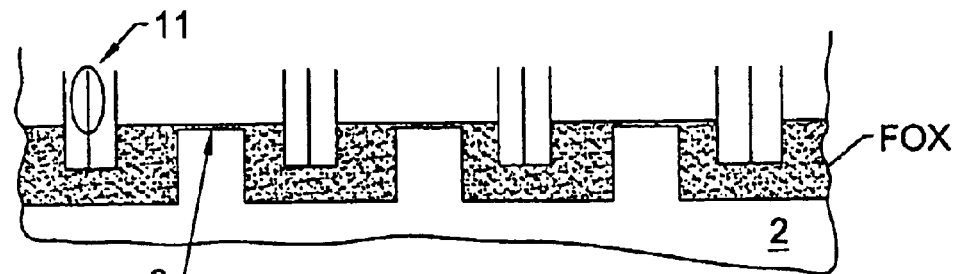

An improved process for planarizing nonvolatile memory cells integrated in a semiconductor substrate will now be described with reference to FIGS. 2A to 2E. A plurality of active areas are formed on a semiconductor substrate 20 which will accommodate the memory cells. The active areas are separated from one another by portions of a layer of field oxide OX. On the substrate 20 a first dielectric layer 21, known as a tunnel oxide layer, and a layer 22 of polycrystalline silicon are then formed.

According to the invention, the process continues with the patterning of the layer 22 to produce a plurality of parallel polycrystalline silicon strips 23, known as floating gates. This patterning step is carried out to produce the floating gate by a different principle than in prior art processes. Instead of patterning the floating gate with vertical walls along the perpendicular direction to the direction of the strips 23, the strips 23 are defined with slanted walls ($\theta<85°$, where $\theta$ is the base angle of the Poly1 layer), e.g., by end-point etching, as shown in FIG. 3. This may be done by plasma etching down to the field oxide while maintaining a high Poly/oxide selectivity.

Advantageously, a trench (or "bed") 24 is dug by an appropriate over-etching operation in the field oxide, which is exposed during defining the floating gate strips 23. The bed 24 dug in the field oxide layer should be of minimal depth $h=h_{ONO}+h'$, where h is the depth of the bed 24 dug in the field oxide, $h_{ONO}$ is the thickness of the interpoly dielectric to be deposited at a later stage (usually of the ONO variety), and h' is the least thickness of polycrystalline silicon necessary to protect the field oxide layer from the interpoly oxide etching during the matrix patterning. The value of h' is selected according to the oxide/silicon selectivity of the etch used and its duration.

The process further includes depositing an interpoly dielectric layer 25, forming a polycrystalline silicon layer (known as Poly2) 26, and optionally depositing a layer 27 of an $MSi_x$ metallic silicide where the metal may be tungsten or cobalt, for example. This layer 27 of metallic silicide may be cascade deposited or formed in situ by a silicidation step carried out on the Poly2 layer previously defined.

Figure 2A:
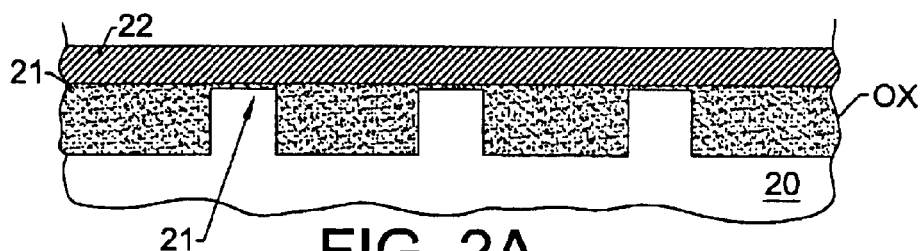
FIGS. 2A to 2G are vertical cross-sectional views, drawn to an enlarged scale, of a portion of a semiconductor substrate in the course of one embodiment of a fabrication process according to the present invention.
Figure 2B:
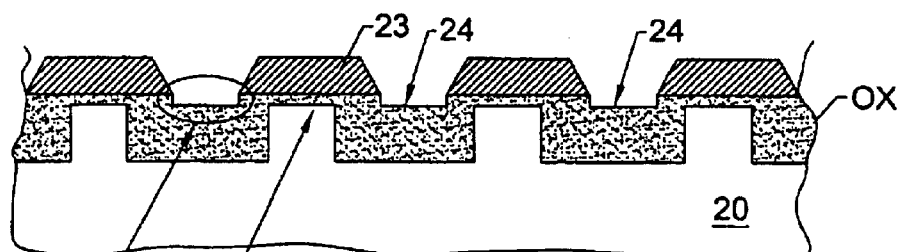
Figure 2C:
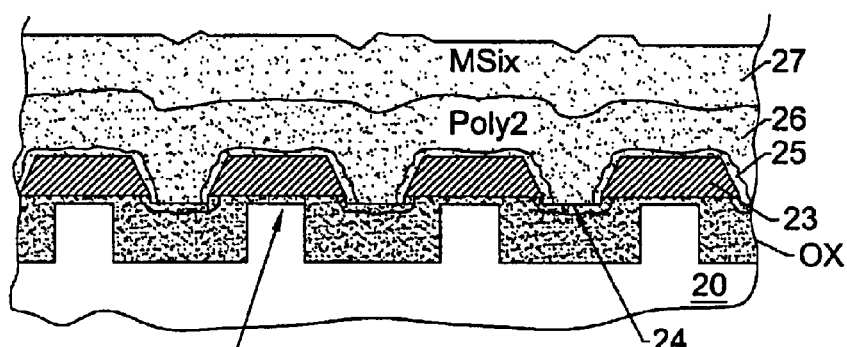
Figure 2D:
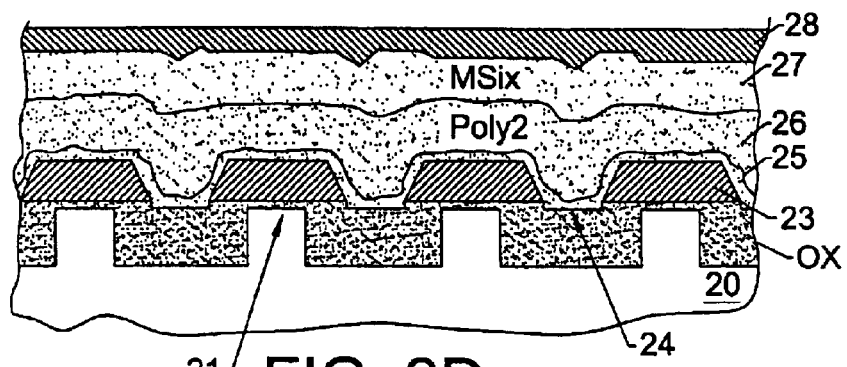
Figure 2E:
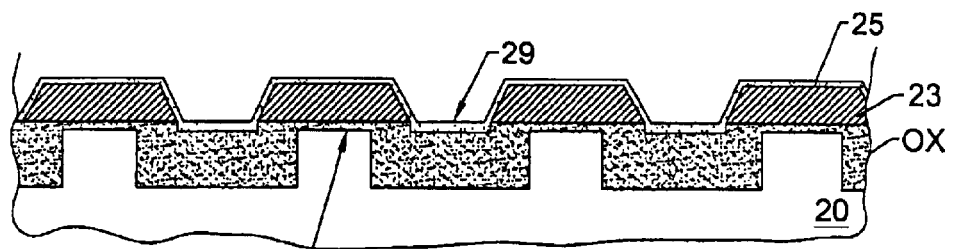
Figure 2F:
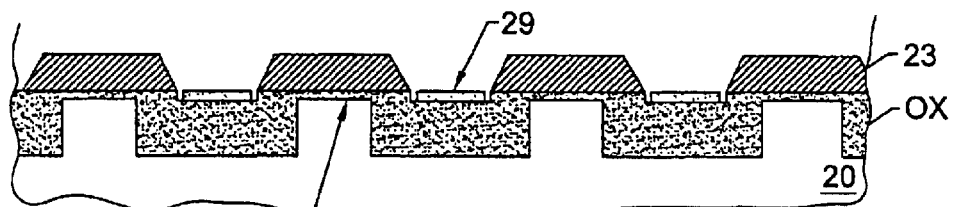
Figure 2G:
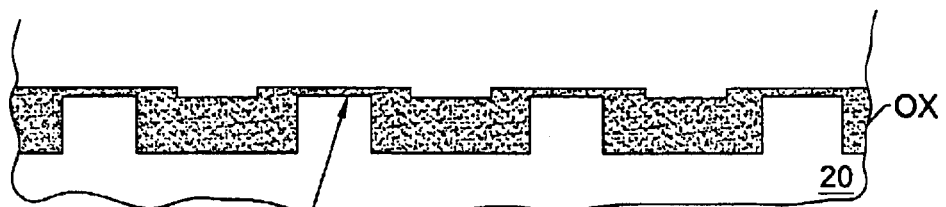

As can be seen in FIGS. 2C and 2D, the sloping walls of the floating gate provide a lead-in for filling the gaps between the floating gate strips so that a smoother profile for the Poly2 is obtained. This reduces the strain on the silicide layer and, ultimately, device faults from technological limitations. Word lines are then defined by a photolithographic process using a resist mask such that the word lines will extend perpendicularly to the floating gate strips 23. FIGS. 2E–2F show a section of the memory matrix, taken parallel to the word lines, but in which the excess Poly2 and silicide layers used for defining the word lines have been removed. The final definition of the cells is completed by using the self-aligned cell technique.

It should be noted that the patterning of Poly1 with sloping walls is only carried out along the direction of the floating gate strips. In fact, in defining the cell at the level of the self-aligned Poly1, the walls of the floating gate which coincide with the walls of the word line are vertically defined. This avoids, therefore, a physical reduction in length of the oxide spacers necessary to produce a gradual cell junction.

Advantageously, the provision of the trench 24 is effective to overcome another critical aspect of defining flash memories, namely the reliability of the insulation or field in the matrix. In fact, the presence of the trench 24 to a greater depth than the thickness of the interpoly layer 25 allows a plug 29 to be formed by the Poly2 layer 26. The presence of this plug 29 (i.e., a spacer) of Poly2 located below the level of the floating gate prevents this oxide from being etched away during the interpoly dielectric etching step without, however, creating shorting bridges of Poly1 between the cells. This is achieved with a minimal loss of the field oxide layer thickness.

To summarize, the process according to the invention allows a reduction of inherent faults in the layer of polycrystalline silicon/metallic silicide. Furthermore, a reduction in consequent faults during the definition of the matrices of flash EEPROM devices may also be achieved due to a morphology that effectively relieves layer straining. This advantageously allows insulation between the matrix cells to retain its integrity. Both advantages are achieved by making minimal variations to the definition of the floating gate strips and while keeping the device matrix substantially unaltered. Furthermore, improved capacitive coupling of the floating gates may be provided because of the slanted sidewalls, which place them closer together.

That which is claimed is:

1. A memory device comprising:
    a semiconductor substrate;
    an oxide layer defining spaced apart active areas in said semiconductor substrate;
    a floating gate region on each respective active area having sidewalls that are slanted with respect to a surface of said semiconductor substrate; and
    a plug in said oxide layer.

2. A memory device according to claim 1 wherein the sidewalls of said floating gate regions are slanted at an inclination angle of less that 85° with respect to the surface of said semiconductor substrate.

3. A memory device according to claim 1 wherein said plug comprises polycrystalline silicon.

4. A memory device according to claim 1 wherein said plug comprises a polycrystalline silicon layer and a dielectric layer therebeneath.

5. A memory device according to claim 4 wherein said oxide layer has a trench therein containing said plug; and wherein the trench has a depth at least greater than a thickness of said dielectric layer beneath said polycrystalline silicon layer.

6. A memory device according to claim 1 wherein said floating gate region comprises polycrystalline silicon.

7. A memory device according to claim 1 further comprising word lines associated with said floating gate regions.

8. A memory device according to claim 7 wherein each word line comprises a polycrystalline silicon layer and a metal silicide layer thereon; and wherein each metal silicide layer is substantially devoid of cracks therein adjacent respective slanted sidewalls.

9. An integrated circuit comprising:
   a semiconductor substrate;
   a first dielectric layer defining spaced apart active areas in said semiconductor substrate, said first dielectric layer having trenches therein;
   a floating gate region on each respective active area having sidewalls that are slanted with respect to a surface of said semiconductor substrate; and
   a respective plug in each trench in said first dielectric layer.

10. An integrated circuit according to claim 9 wherein the sidewalls of said floating gate regions are slanted at an inclination angle of less than 85° with respect to the surface of said semiconductor substrate.

11. An integrated circuit according to claim 9 wherein said plug comprises a polycrystalline silicon layer and a second dielectric layer therebeneath.

12. An integrated circuit according to claim 11 wherein each trench has a depth at least greater than a thickness of said second dielectric layer beneath said polycrystalline silicon layer.

13. An integrated circuit according to claim 9 wherein said floating gate region comprises polycrystalline silicon.

14. An integrated circuit according to claim 9 further comprising word lines associated with said floating gate regions.

15. An integrated circuit according to claim 14 wherein each word line comprises a polycrystalline silicon layer and a metal silicide layer thereon; and wherein each metal silicide layer is substantially devoid of cracks therein adjacent respective slanted sidewalls.

16. An integrated circuit according to claim 9 wherein said first dielectric layer comprises silicon oxide.

17. An integrated circuit comprising:
   a semiconductor substrate;
   a first dielectric layer defining spaced apart active areas in said semiconductor substrate, said first dielectric layer having trenches therein;
   a floating gate region comprising polycrystalline silicon on each respective active area having sidewalls that are slanted at an inclination angle of less than 85° with respect to a surface of said semiconductor substrate; and
   a respective plug in each trench and comprising a polycrystalline silicon layer and a second dielectric layer therebeneath.

18. An integrated circuit according to claim 17 wherein each trench has a depth at least greater than a thickness of said second dielectric layer beneath said polycrystalline silicon layer.

19. An integrated circuit according to claim 17 further comprising word lines associated with said floating gate regions.

20. An integrated circuit according to claim 19 wherein said word lines each comprises a polycrystalline silicon layer and a metal silicide layer thereon; and wherein each metal silicide layer is substantially devoid of cracks therein adjacent respective slanted sidewalls.

21. An integrated circuit according to claim 17 wherein said first dielectric layer comprises silicon oxide.

* * * * *